United States Patent
Crandall et al.

[11] Patent Number: 5,363,067
[45] Date of Patent: Nov. 8, 1994

[54] MICROSTRIP ASSEMBLY

[75] Inventors: Mark A. Crandall, Sunrise; William J. Wingfield, Lauderhill; Leng H. Ooi, Sunrise, all of Fla.

[73] Assignee: Motorola, Inc., Schaumburg, Ill.

[21] Appl. No.: 63,477

[22] Filed: May 19, 1993

[51] Int. Cl.$^5$ .............. H03B 5/18; H01P 7/08
[52] U.S. Cl. .................. 331/107 SL; 333/219; 333/247
[58] Field of Search ........... 333/204, 205, 219, 238, 333/246, 247; 361/784, 790, 792–795; 257/686, 700, 728; 331/96, 107 SC, 107 DP; 174/52.1

[56] References Cited

U.S. PATENT DOCUMENTS

| | | | |
|---|---|---|---|
| 4,654,694 | 3/1987 | Val | 257/765 |
| 4,801,905 | 1/1989 | Becker | 333/238 |
| 4,953,001 | 8/1990 | Kaiser, Jr. et ala. | 333/247 X |
| 4,998,077 | 3/1991 | Nanni et al. | 333/219 X |
| 5,172,077 | 12/1992 | Funada | 331/107 SL X |
| 5,172,303 | 12/1992 | Bernardoni | 361/744 |
| 5,227,739 | 7/1993 | Mandai et al. | 331/107 SL X |

FOREIGN PATENT DOCUMENTS

| | | | |
|---|---|---|---|
| 0019203 | 1/1986 | Japan | 333/219 |
| 61-101067 | 5/1986 | Japan | . |
| 0284501 | 11/1990 | Japan | 333/204 |

Primary Examiner—Seungsook Ham
Attorney, Agent, or Firm—Pedro P. Hernandez

[57] ABSTRACT

A microstrip assembly (100), includes a first substrate such as a multilayer substrate (102, 106 and 112) having pockets or cavity areas (104). A second substrate (110) includes transmission lines (108) on its first surface, and a ground plane on its second surface which help form a microstrip resonator. The first and second substrates are attached with the transmission lines (108) resting inside of the areas defined by cavity areas (104). By providing an air gap on top of transmission lines (108), the microstrip assembly (100) can exhibit enhanced characteristics, while still maintaining the high Q characteristics of a microstrip.

11 Claims, 3 Drawing Sheets

MICROSTRIP ASSEMBLY

TECHNICAL FIELD

This invention relates in general to microstrip assemblies, and more specifically to a mircrostrip assembly providing improved shielding characteristics.

BACKGROUND

Microstrip oscillator circuits typically exhibit a high degree of sensitivity to changes in the surrounding environment causing them to become microphonic. Because of the problem with microphonics and other types of interference, stripline resonators are often used instead of microstrip resonators when designing oscillator circuits since they are self-shielding due to their dual ground plane architecture. The tradeoffs the designer faces when choosing a stripline rather than a microstrip are lower Q and higher capacitance. The lower Q and higher capacitance exhibited by the stripline causes the tuning range of the oscillator circuit incorporating the stripline to be reduced, as compared to when using a microstrip resonator.

Another problem which is encountered when designing oscillators using microstrip or striplines is that they take up valuable space on the oscillator's circuit board. A need thus exists for a microstrip assembly which retains the higher Q's associated with microstrip structures and provides the additional shielding against interference and microphonics found in stripline structures, as well as minimizes the amount of board area required to implement the microstrip.

DETAILED DESCRIPTION OF THE PREFERRED EMBODIMENT

Figure 1:
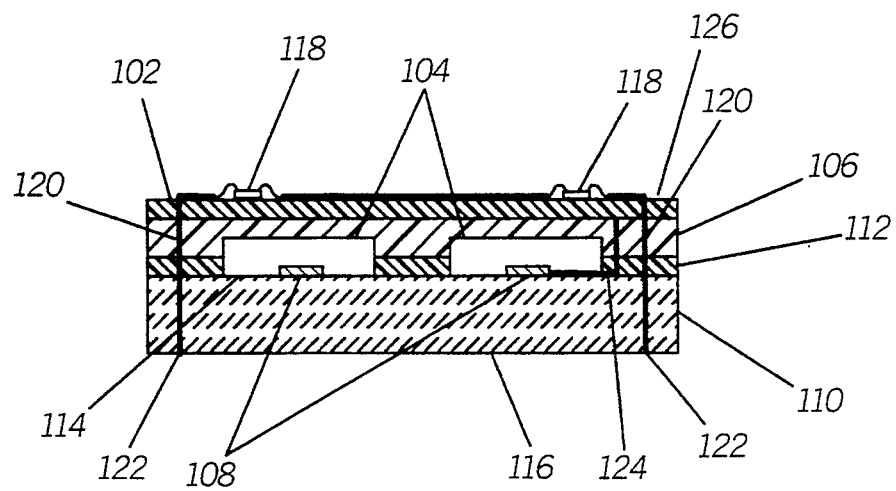
FIG. 1 shows a cross-section view of a microstrip assembly in accordance with the present invention.

While the specification concludes with claims defining the features of the invention that are regarded as novel, it is believed that the invention will be better understood from a consideration of the following description in conjunction with the drawing figures, in which like reference numerals are carried forward.

Referring now to FIG. 1, a microstrip assembly 100 in accordance with the present invention is shown. Microstrip assembly 100 includes a first substrate such as a multilayer printed circuit board which includes a first layer 102 having first and second surfaces, a second layer 106 having first and second surfaces, and a third layer 112 having first and second surfaces. The first substrate can be formed from insulating material such as glass epoxy, ceramic, standard printed circuit board material such as FR4 (a glass epoxy mixture), or other suitable materials. The substrate can have multiple layers which are sandwiched together as shown in FIG. 1, or it can be designed using a single piece substrate which has pockets or cavity areas 104 drilled out.

Portions of the second 106 and third layers 112 have been removed, preferably by punching out the substrate layers in order to form cavities 104, once layers 102, 106 and 112 are laminated together. A second substrate 110 which forms a microstrip section comprises a ceramic substrate 110 having a first surface 114, and a second surface 116. First surface 114 is soldered to the first multilayer substrate using conventional solder reflow techniques.

The first layer 102 of the multilayer substrate includes a component surface having a plurality of electronic components 118 such as components used in the design of a voltage-controlled-oscillator (VCO). Electronic components 118 are selectively interconnection with each other and to the microstrip resonators formed by transmission lines 108. Metallized vias 120 provide electrical interconnection between the first and second substrates. Interconnection pads on the second surface of layer 112 make contact with pads located on surface 114 upon the first multilayer substrate is attached to second substrate 110, Substantially within the area defined by cavities 104 are found one or more transmission lines 108 which are disposed on surface 114 of second substrate 110. Located on the second surface 116 of substrate 110 is a metallized plane which helps form a ground plane (not shown). Also located on second surface 116 are a plurality of contact pads or input/output pads 122 which are electrically isolated from the ground plane, and help provide input/output capability to assembly 100. In the preferred embodiment, assembly 100 forms a voltage controlled oscillator which utilizes a microstrip resonator, which will be discussed later.

Although the first substrate has been shown as a multilayer substrate, a single substrate having first and second surfaces and thick enough to allow the formation of a cavity area could also be used. In order to enhance the shielding provided to the microstrip, another ground plane 126 is preferably located on the component surface of the first substrate and substantially above transmission line 108. Ground plane 126 is electrically isolated from the electronic components 118 and their associated electrical runners in order not to short them to ground potential.

Figure 2:
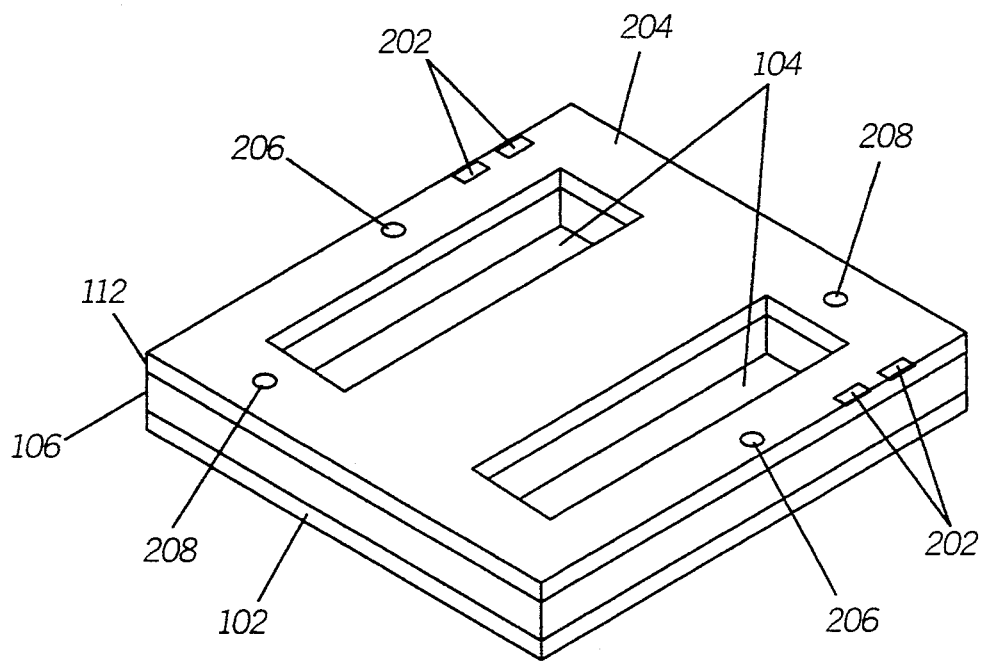
FIG. 2 shows the first substrate which helps form the microstrip assembly shown in FIG. 1.

Referring now to FIG. 2, the multilayer substrate section of the microstrip assembly shown in FIG. 1 is shown. Cavity areas 104 are clearly shown as formed by the lamination of layers 102, 106 and 112. Layers 106 and 112 have a portion punched out prior to lamination in order to form cavity areas 104. As previously discussed, layers 102, 106 and 112 can be formed from any one of several materials such as ceramic, FR4, etc. Although shown as a multilayer substrate, the first substrate can be designed using a single thick layer of ceramic or other suitable material which has cavity areas 104 drilled out. The second surface 204 of layer 112 includes a plurality of interconnection pads 202 which are used to interconnect the components on layer 102 to the second substrate 110. Pads 202 are cladded with solder prior to the multilayer substrate being reflowed to second substrate 110. Pads 202 align with similar pads located on first surface 114 of substrate 110.

The height of cavity areas or pockets 104 will depend on the particular design which is being implemented. Since the dielectric of air is equal to one, an electronic assembly such as shown in FIG. 1 can be designed which includes a microstrip resonator or filter which exhibits the shielding characteristics of a stripline, but retains the high Q and low capacitance characteristics of a microstrip.

Figure 3:
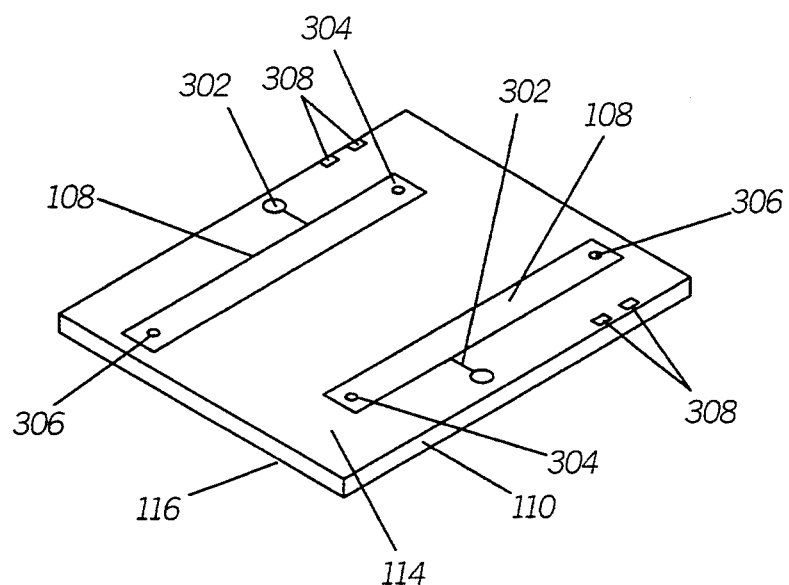
FIG. 3 shows the second substrate which helps form the microstrip assembly shown in FIG. 1.

In FIG. 3, second substrate layer 110 is shown. A pair of transmission lines 108 are located on first surface 114. Each transmission line 108 includes a first and second terminal 306 and 304, respectively. A tap point 302 is located at a predetermined point along the length of transmission line 108. On second surface 116, a metallization pattern forming a ground plane is located covering a substantial portion of surface 116. Second terminals 304 are electrically connected using metallized vias to the ground plane on surface 116. First terminals 306 which are at the open end of transmission lines 108 are soldered to pads 208 located on the multilayer substrate once the two substrates are attached to each other. Similarly, tap points 302 are soldered to pads 206.

Figure 4:
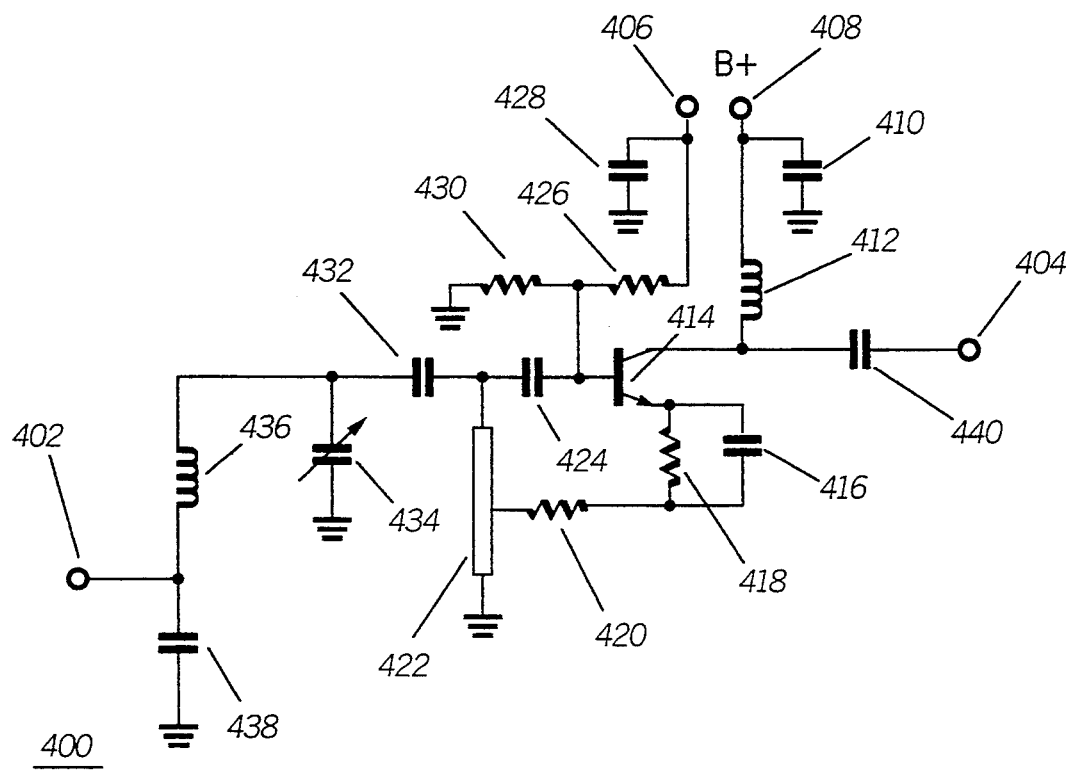
FIG. 4 shows a schematic of a voltage-controlled-oscillator (VCO) in accordance with the present invention.

Referring to FIG. 4, there is shown a voltage-controlled-oscillator (VCO) in accordance with the present invention. VCO 400 is typically used as part of a phase-lock-loop (PLL) synthesizer for use in communication equipment. VCO 400 includes a control voltage input port 402 for receiving a control voltage signal. In a typical radio application, input port 402 receives the control voltage from a portion of the synthesizer. Connected to input port 402 is a capacitor 438 coupled to ground and a series inductor 436. The other end of inductor 436 is connected to variable capacitor 434. A series capacitor 432 couples variable capacitor 434 to tapped resonator element 422, which has one end coupled to ground. Tapped resonator element 422 is a shielded microstrip as shown in FIG. 1. Oscillator 400 includes an RF amplifier such as NPN transistor 414. The other end of tapped resonator 422 is capacitively coupled via capacitor 424 to the base of NPN transistor 414.

Tapped resonator 422 is selectively tapped depending on the required operating parameters of oscillator 400 by one end of resistor 420. The other end is connected to a resistor 418 and inductor 416 which are in parallel to each other and their other ends are connected to the emitter of transistor 414. Also included as part of oscillator 400 is inductor 412, which is coupled between B+ voltage terminal 408 and the collector of transistor 414. Also coupled to the collector of transistor 414 is a coupling capacitor 440 which is connected between the collector of transistor 414 and output port 404. A capacitor 410 is coupled between B+ port 408 and ground potential. A biasing circuit coupled to base bias voltage terminal 406 is comprised of resistors 426 and 430 and capacitor 428 provide biasing to transistor 414. Resistors 426 and 430 form a voltage divider circuit which sets the base bias voltage for transistor 414. The grounded end of resonator 422 relates to grounded end 304, shown in FIG. 3. Tapped terminal 302 of one of the transmission lines 108 shown in FIG. 3, relates to the tapped end which is connected to resistor 420, in FIG. 4. While the other end of resonator 422 which is connected to capacitors 432 and 424, relates to the open-end terminal 306 of one of the transmission lines shown in FIG. 3.

Figure 5:
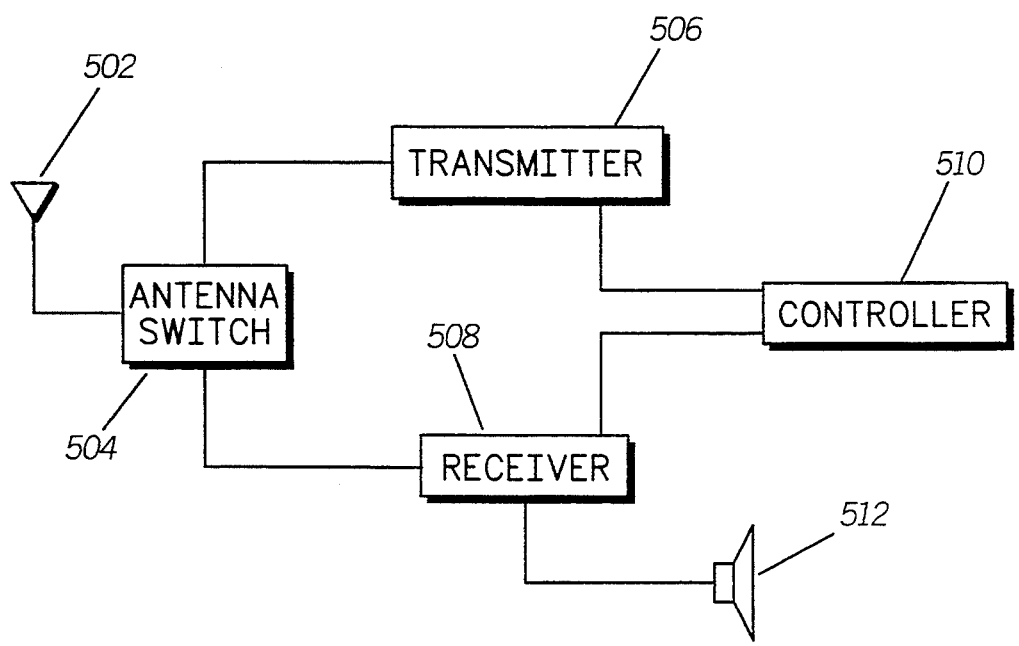
FIG. 5 shows a block diagram of a radio in accordance with the present invention.

Although the VCO in FIG. 4, only utilized one of the microstrip resonators shown in FIG. 1, one could use both of the resonators 108, in the VCO design by simply using one of the resonators specially for a receive oscillator and one for a transmit oscillator when designing a communication device such as a radio as shown in FIG. 5. Although FIG. 1, shows two resonators 108, those skilled in the art will realize that any number of transmission lines can be provided in the assembly. Also, transmission lines 108 can be designed for use as filters or any other type of design which can benefit by using a microstrip.

In FIG. 5, a block diagram of a radio in accordance with the present invention is shown. The radio comprises an antenna 502 selectively coupled by an antenna switch 504 between a transmitter 506 and a receiver 508. Both transmitter 506 and receiver 508 are conventional radio frequency devices as known in the art except that the radio includes a VCO 400 as shown in FIG. 4. A controller 510 such as a microprocessor like a MC68HC11 manufactured by Motorola, Inc. having built-in memory and input/output (I/O) capabilities controls the operation of the radio. A speaker 512 is coupled to receiver 508 for providing audio information to the radio user.

In summary, the present invention provides for a microstrip assembly which has the shielding characteristics of a stripline while maintaining the higher Q's and lower capacitance of a microstrip. By burying the transmission line(s) (microstrip resonator sections) 108 between the first and second substrates, the present invention allows for the design of a compact oscillator or other type of electronic circuit which requires the use of a microstrip. By providing an air gap which is created by cavity areas 104, the assembly exhibits the enhanced shielding attributed to stripline designs, but yet maintains the higher Q's associated with microstrip designs. Although the cavity area 104 was shown to be formed on the first substrate in the preferred embodiment, cavity area 104 could have been formed on second substrate 110 with the transmission line resting inside of the cavity. What is required is that an air gap be located substantially on tip of transmission line 108 in order for the assembly to retain the high Q characteristics of a microstrip.

While the preferred embodiment of the invention have been illustrated and described, it will be clear that the invention is not so limited. Numerous modifications, changes, variations, substitutions and equivalents will occur to those skilled in the art without departing from the spirit and scope of the present invention as defined by the appended claims.

What is claimed is:

1. A microstrip assembly, comprising:
   a first substrate having first and second surfaces, the second surface having at least one cavity area;
   at least one electronic component attached to the first surface of the first substrate;
   a second substrate having first and second surfaces, a transmission line disposed on the first surface and a ground plane disposed on the second surface;
   the first and second substrates are attached to each other such that the cavity area is substantially above the transmission line; and
   a plurality of input/output pads located on the second surface of the second substrate, said plurality of input/output pads are electrically isolated from the ground plane and electrically coupled to the at least one electronic component.

2. A microstrip assembly as defined in claim 1, further comprising a ground plane disposed on the first surface of the first substrate and located substantially above the transmission line.

3. A microstrip assembly as defined in claim 1, wherein the first and second substrates are soldered to each other.

4. A microstrip assembly as defined in claim 1, wherein the second substrate is comprised of a ceramic material.

5. A microstrip assembly as defined in claim 4, wherein the first substrate comprises a multilayer substrate.

6. An oscillator, comprising:
   a microstrip resonator comprised of:
      a first substrate having first and second surfaces, the second surface having at least one cavity area;
      a second substrate having first and second surfaces, a transmission line disposed on the first surface and a ground plane disposed on the second surface;
      the first and second substrates are attached to each other such that the cavity area substantially covers the transmission line; and
   and an amplifier electrically coupled to the microstrip resonator and attached to the first surface of the first substrate.

7. An oscillator as defined in claim 6, wherein the second substrate is comprised of a ceramic material, and the first substrate comprises a multilayer substrate.

8. An oscillator as defined in claim 6, wherein the oscillator includes a voltage input port coupled to the microstrip resonator for providing a voltage-controlled-oscillator.

9. A communication device, comprising:
   a receiver; and
   an oscillator coupled to the receiver, the oscillator comprised of:
      a microstrip resonator; comprising:
         a first substrate having first and second surfaces, the second surface having at least one cavity area;
         at least one electronic component attached to the first surface of the first substrate;
         a second substrate, having first and second surfaces, a transmission line disposed on the first surface and a ground plane disposed on the second surface;
         the first and second substrates are attached to each other such that the cavity area substantially covers the transmission line; and
      an amplifier electrically coupled to the microstrip resonator; and
      a plurality of input/output pads located on the second surface of the second substrate, said plurality of input/output pads are electrically isolated from the ground plane and electrically coupled to the at least one electronic component.

10. A communication device as defined in claim 9, wherein the first and second substrates are soldered to each other.

11. A communication device as defined in claim 9, wherein the second substrate is comprised of a ceramic material, and the first substrate comprises a multilayer substrate.

* * * * *